US007928752B2

(12) United States Patent
Lee et al.

(10) Patent No.: US 7,928,752 B2
(45) Date of Patent: Apr. 19, 2011

(54) DISPLAY DEVICE, DISPLAY DEVICE TESTING SYSTEM AND METHOD FOR TESTING A DISPLAY DEVICE USING THE SAME

(75) Inventors: Sang Jun Lee, Jeollanam-Do (KR); Young Gil Kim, Suwon-Si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 999 days.

(21) Appl. No.: 11/680,679

(22) Filed: Mar. 1, 2007

(65) Prior Publication Data

US 2008/0036715 A1 Feb. 14, 2008

(30) Foreign Application Priority Data

Aug. 3, 2006 (KR) ........................ 10-2006-0073432

(51) Int. Cl.
*G01R 31/26* (2006.01)

(52) U.S. Cl. .................................................. 324/760.01

(58) Field of Classification Search ........................ None
See application file for complete search history.

(56) References Cited

U.S. PATENT DOCUMENTS

| | | | | |
|---|---|---|---|---|
| 5,465,053 | A * | 11/1995 | Edwards | 324/770 |
| 7,456,647 | B2 * | 11/2008 | Jeon et al. | 324/770 |
| 2006/0103410 | A1 * | 5/2006 | Jeon | 324/770 |

* cited by examiner

*Primary Examiner* — Roberto Velez
(74) *Attorney, Agent, or Firm* — F. Chau & Associates, LLC

(57) ABSTRACT

A display device testing system and a method for testing a display device using the same, which are capable of testing whether a display panel is defective or not according to a variation of the frame frequency and whether the driver module operates normally or not even at a voltage higher than a normal operation voltage. The display device testing system includes a display panel including a plurality of gate lines; a driver module including a gate driver unit for sequentially supplying a gate voltage to the plurality of gate lines in response to a test, vertical synchronization start signal; and a testing module for supplying a test vertical synchronization start signal to the driver module.

10 Claims, 7 Drawing Sheets

DISPLAY DEVICE, DISPLAY DEVICE TESTING SYSTEM AND METHOD FOR TESTING A DISPLAY DEVICE USING THE SAME

This application claims priority to Korean Patent application No. 10-2006-0073432, filed on Aug. 3, 2006, and all the benefits accruing therefrom under 35 U.S.C. §119, the contents of which are herein incorporated by reference in its entirety.

BACKGROUND OF THE INVENTION

1. Technical Field

The present disclosure relates to a display device, a display device testing system, and a method for testing a display device using the same and, more particularly, to a testing module for a display device capable of testing for a defect of a display panel with a variable frame frequency.

2. Discussion of the Prior Art

A display device includes a flat display panel for displaying an image, and a driving means for applying operation signals to the flat display panel. The display device may further include a backlight for supplying light to the flat display panel. As an example of such a flat display panel, a liquid crystal display panel includes a plurality of pixels including a liquid crystal layer between a pixel electrode and a common electrode. The liquid crystal display panel displays an image by adjusting light transmittance of the liquid crystal layer by changing an electric field that is present between the two electrodes of the pixel.

After being manufactured, the display device is subjected to several tests including a test for determining whether the display panel operates or not and a test for detecting defective pixels.

The display device is also tested to determine whether it works in an environment that is inferior to actual use environments. Through the tests, problems that may be encountered during use of the display device can be recognized in advance.

There is no test means, however, capable of detecting a defect of a display panel with a variable frame frequency. Accordingly, it is difficult to recognize, in advance, problems occurring upon variation of the frame frequency.

SUMMARY OF THE INVENTION

Accordingly, exemplary embodiments of the present invention are conceived to solve the aforementioned problems in the prior art. Exemplary embodiments of the present invention provide a display device, a display device testing system, and a method for testing a display device using the same, which make it possible to test whether a display panel is defective using a variable frame frequency and to test whether a driver module operates normally, even at a voltage higher than a specified operation voltage.

According to an exemplary embodiment of the present invention, there is provided a display device comprising a display panel including a plurality of gate lines; a gate driver unit for supplying a gate voltage to the gate lines in response to a vertical synchronization start signal or a test vertical synchronization start signal; and a connector unit including a pin for providing the test vertical synchronization start signal to the gate driver unit.

The device further comprises a timing control unit for generating the vertical synchronization start signal, and a switching unit for supplying either the vertical synchronization start signal or the test vertical synchronization start signal to the gate driver unit. The pin for providing the vertical synchronization start signal is electrically connected to the switching unit. The switching unit may be made integrally with the gate driver unit.

The test vertical synchronization start signal has a variable frequency. That is, the test vertical synchronization start signal has a frequency 0 to 100% higher or lower than that of the vertical synchronization start signal.

The connector unit comprises a first connector for receiving an external control signal, and a second connector for receiving an external voltage and an external test voltage. The pin for receiving the test vertical synchronization start signal is provided in the second connector. The external test voltage is 0 to 100% higher or lower than the external voltage.

According to an exemplary embodiment of the present invention, there is provided a display device comprising a display panel including a plurality of gate lines; a gate driver unit for sequentially supplying a gate voltage to the gate lines in response to a vertical synchronization start signal or an external test vertical synchronization start signal; and a switching unit for supplying either the vertical synchronization start signal or the external test vertical synchronization start signal to the gate driver unit.

According to an exemplary embodiment of the present invention, there is provided a display device comprising a display panel including a plurality of gate lines; a gate driver unit for sequentially supplying a gate voltage to the plurality of gate lines in response to a start signal; a control signal generating unit for generating the start signal in response to a vertical synchronization start signal or an external test vertical synchronization start signal; and a connector unit including a pin for supplying the test vertical synchronization start signal to the control signal generating unit.

The device further comprises a timing control unit for generating the vertical synchronization start signal, and a switching unit for supplying either the vertical synchronization start signal or the test vertical synchronization start, signal to the control signal generating unit. A pin for providing the vertical synchronization start signal is electrically connected to the switching unit. The switching unit may be made integrally with the control signal generating unit.

The test vertical synchronization start signal is provided with a variable frequency.

According to an exemplary embodiment of the present invention, there is provided a display device comprising: a display panel including a plurality of gate lines; a gate driver unit for sequentially supplying a gate voltage to the gate lines in response to a start signal; a control signal generating unit for generating the start signal in response to a vertical synchronization start signal or an external test vertical synchronization start signal; and a switching unit for supplying the vertical synchronization start signal and the external test vertical synchronization start signal to the control signal generating unit.

According to an exemplary embodiment of the present invention, there is provided a display device comprising a display panel including a plurality of pixels provided in respective display areas of upper and lower substrates; a gate driver unit connected to the plurality of pixels; a switching unit connected to the gate driver unit; and a connector unit having at least one pin connected to the switching unit.

The pin receives an external signal that has a variable frequency.

The gate driver unit is provided in a peripheral area of the lower substrate.

The device further comprises a printed circuit board including the switching unit and the connector, and a flexible printed circuit board for electrically connecting the printed circuit board and the lower substrate.

A control signal generating unit may be provided between the gate driver unit and the switching unit.

According to an exemplary embodiment of the present invention, there is provided a display device comprising a display panel including an upper substrate and a lower substrate, each of the upper and lower substrates having a display area and a peripheral area, and a plurality of pixels provided in the display areas of the upper and lower substrates; a gate driver unit provided in the peripheral area of the lower substrate and connected to the pixels of the display panel; a first printed circuit board electrically connected to the lower substrate, a data driver unit mounted on the printed circuit board and connected to the pixels; a switching unit mounted on the printed circuit board and connected to the gate driver unit; a timing control unit mounted on the printed circuit board and connected to the switching unit and the data driver unit; a gradation voltage generating unit mounted on the printed circuit board and connected to the data driver unit; and a connector unit provided in the printed circuit board and having at least one pin connected to the switching unit.

The switching unit electrically connects the timing control unit and the gate driver unit to each other or the pin and the gate driver unit to each other in response to an input signal on the pin of the connector.

According to an exemplary embodiment of the present invention, there is provided a display device testing system comprising a driver module including a gate driver unit for sequentially supplying a gate voltage to a plurality of gate lines of a display panel in response to a test vertical synchronization start signal; and a testing module for supplying the test vertical synchronization start signal to the driver module.

The test vertical synchronization start signal has a variable frequency. The driver module comprises a timing control unit for generating a vertical synchronization start signal, and a switching unit for supplying either the vertical synchronization start signal or the test vertical synchronization start signal to the gate driver unit.

The driver module comprises a converter unit for supplying a gate turn-on voltage and a gate turn-off voltage to the gate driver unit depending on whether the testing module is connected to the driver module, and the testing module comprises a voltage generating unit for supplying a test gate turn-on voltage and a test gate turn-off voltage to the gate driver unit.

The driver module comprises a control signal generating unit for generating a clock signal and an inverted clock signal in response to the gate turn-on voltage and the gate turn-off voltage or the test sate turn-on voltage and the test sate turn-off voltage, and supplying the clock signal and the inverted clock signal to the gate driver unit.

In this case, the driver module and the testing module are detachably provided.

According to an exemplary embodiment of the present invention, there is provided a display device testing system comprising a driver module including a gate driver unit and a data driver unit connected to a plurality of pixels provided in display areas of upper and lower substrates of a display panel, a switching unit connected to the gate driver unit, and a timing control unit connected to the switching unit and the data driver unit; and a testing module including a signal generating unit connected to the switching unit.

The signal generating unit generates a signal having a variable frequency.

The driver module comprises a first printed circuit board electrically connected to the lower substrate via a flexible printed circuit board and including a voltage input connector and a signal input connector, and the data driver unit, the switching unit, and the timing control unit are provided on the first printed circuit board.

The testing module comprises a second printed circuit board electrically connected to any one of the voltage input connector and the signal input connector of the first printed circuit board, and the signal generating unit is provided on the second printed circuit board.

According to an exemplary embodiment of the present invention, there is provided a method for testing a display device comprising the steps of supplying an external test, vertical synchronization start signal having a variable frequency to the display device; and sequentially supplying a gate voltage to a plurality of gate lines of the display device in response to the test vertical synchronization start signal.

The test vertical synchronization start signal has a frequency 0 to 100% higher or lower than that of a vertical synchronization start, signal for the display device that is used in normal operation. The gate voltage is 0 to 100% higher or lower than a voltage for the display device that is used in normal operation.

The method further comprises, after the step of sequentially supplying the gate voltage to a plurality of gate lines of the display device, the steps of changing a frequency of the test vertical synchronization start signal; and sequentially supplying the gate voltage to the plurality of gate lines of the display device in response to the changed test vertical synchronization start signal.

In the step of sequentially supplying the gate voltage to the plurality of gate lines of the display device, a data signal is supplied to the plurality of data lines of the display device.

According to an exemplary embodiment of the present invention there is provided a testing module for a display device having a gate driver unit, the testing module comprising a signal generating unit for supplying a test vertical synchronization start signal having a variable frequency to the gate driver unit.

The signal generating unit generates the test, vertical synchronization start signal having a frequency 0 to 100% higher or lower than that of a vertical synchronization start signal for the display device used in a normal operation.

The testing module further comprises a voltage generating unit for supplying a test gate turn-on voltage and a test gate turn-off voltage to the gate driver unit.

BRIEF DESCRIPTION OF THE DRAWINGS

Exemplary embodiments of the present invention will be understood in more detail from the following descriptions taken in conjunction with the accompanying drawings, in which.

DETAILED DESCRIPTION OF EXEMPLARY EMBODIMENTS

Hereinafter, exemplary embodiments of the present invention will be described in detail with reference to the accompanying drawings. This invention may, however, be embodied in different forms and should not be construed as limited to the exemplary embodiments set forth herein. Rather, these exemplary embodiments are provided so that this disclosure will be thorough and complete and will permit those skilled in the art to fully understand the scope of the invention. Like numbers refer to like elements throughout.

Figure 1:
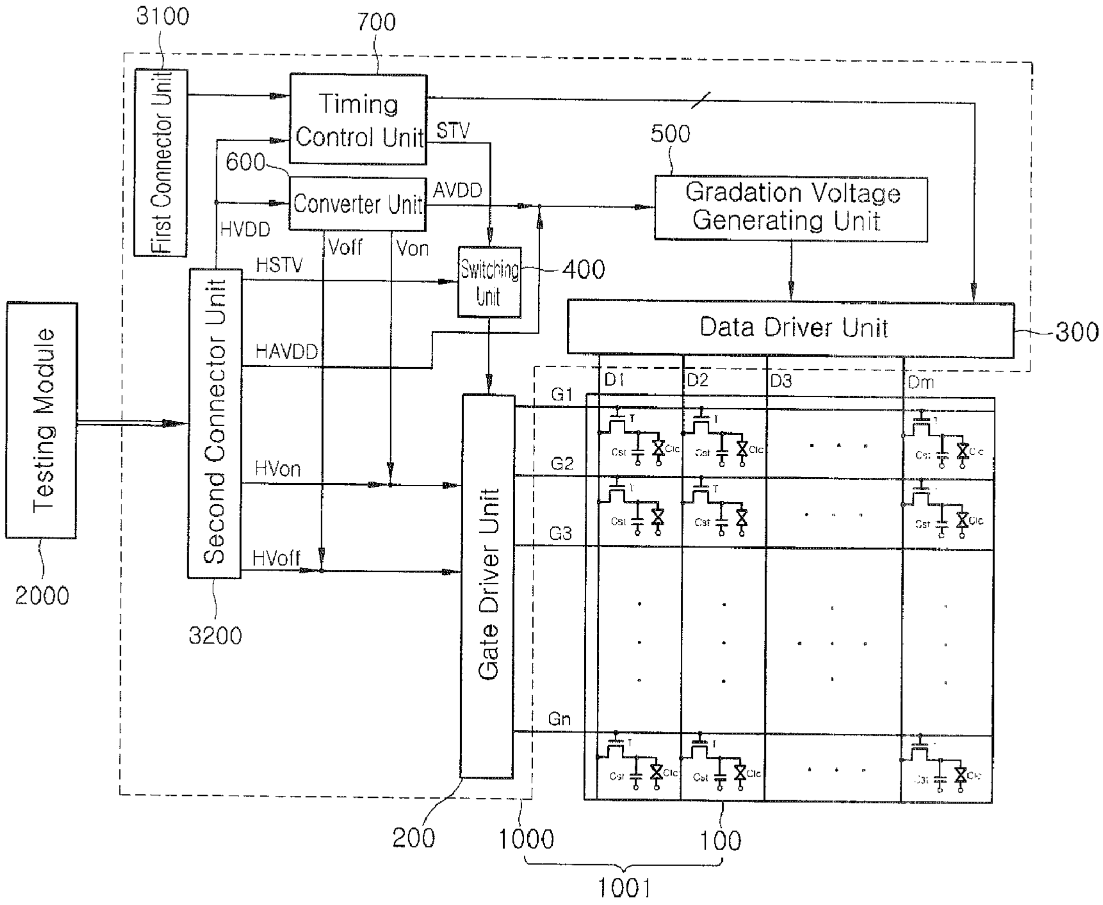
FIG. 1 is a conceptual block diagram of a display device testing system according to an exemplary embodiment of the present invention.
Figure 2:
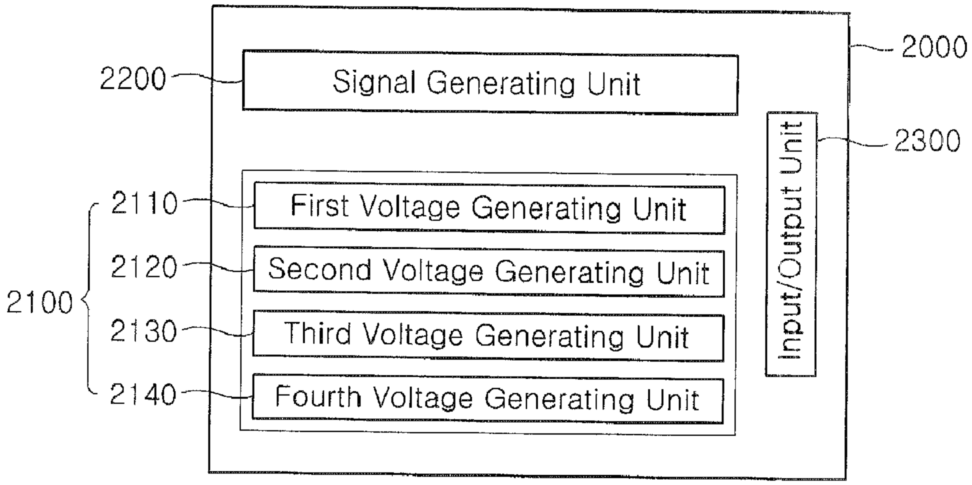
FIG. 2 is a conceptual block diagram of a testing module according to an exemplary embodiment of the present invention.
Figure 3:
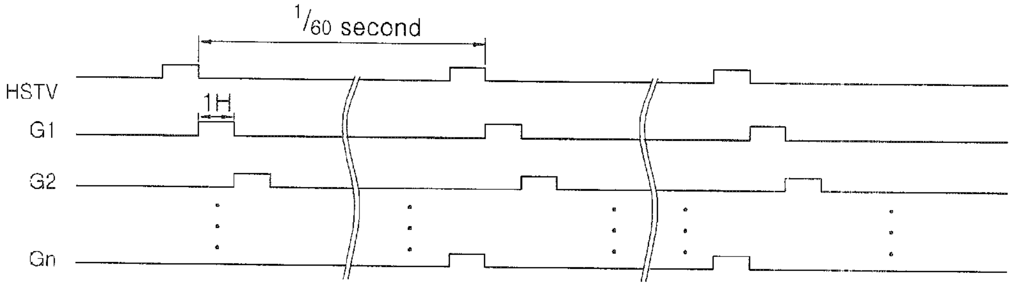
FIGS. 3 and 4 are waveform diagrams illustrating operation of the display device testing system according to an exemplary embodiment of the present invention.
Figure 4:
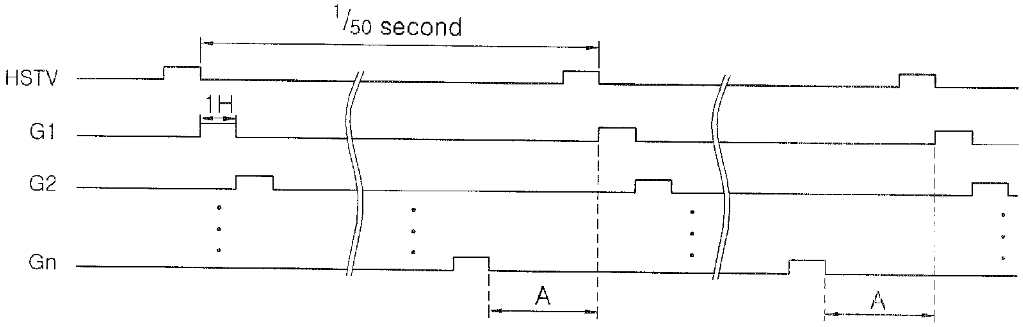
Figure 5:
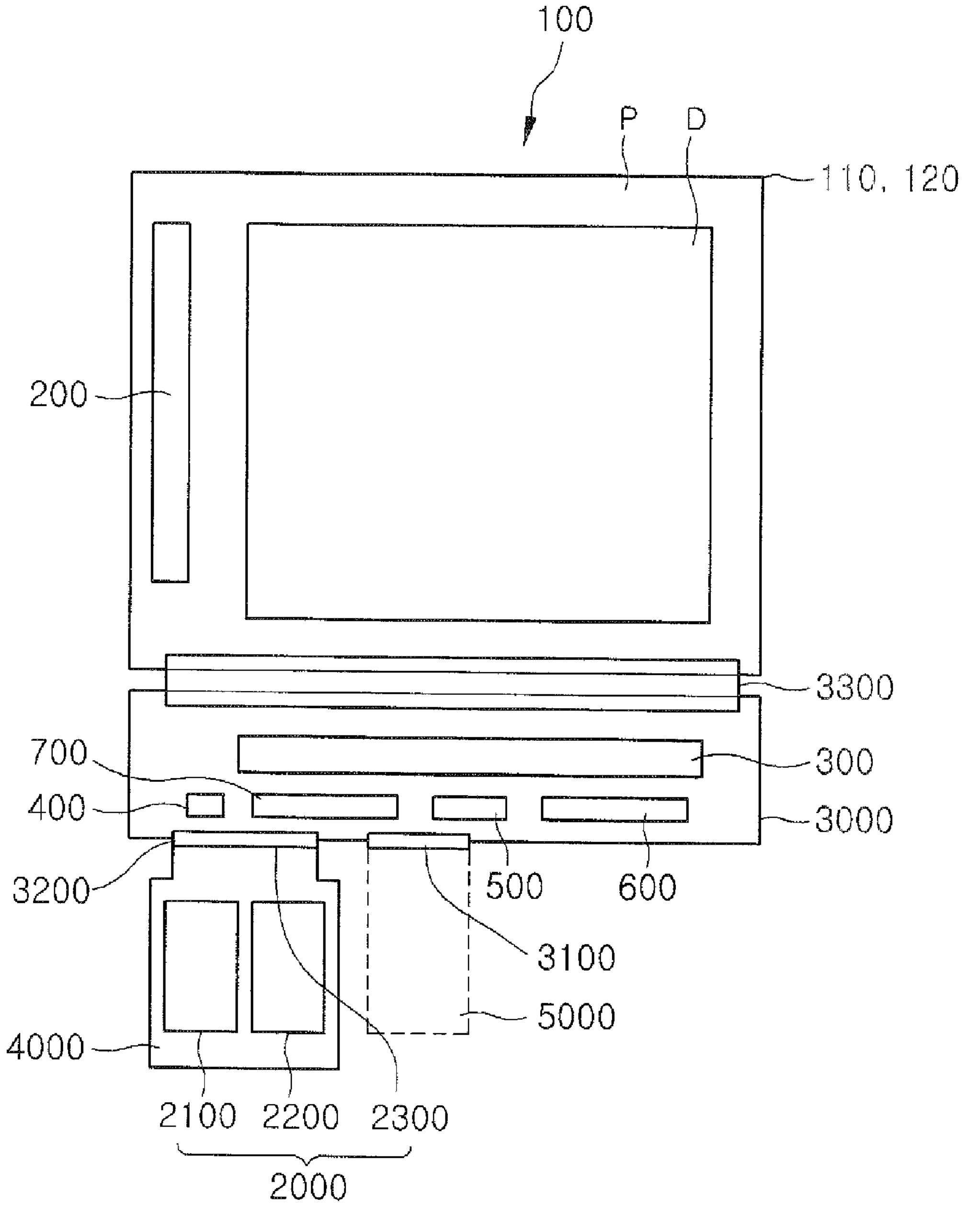
FIG. 5 is a conceptual plan view illustrating the display device testing system according to an exemplary embodiment of the present invention.

FIG. 1 is a conceptual block diagram of a display device testing system according to an exemplary embodiment of the present invention. FIG. 2 is a conceptual block diagram of a testing module according to the exemplary embodiment of FIG. 1. FIGS. 3 and 4 are waveform diagrams illustrating operation of the display device testing system according to the exemplary embodiment of FIG. 1. FIG. 5 is a conceptual plan view illustrating the display device testing system according to the exemplary embodiment of FIG. 1.

Referring to FIGS. 1 through 5, a display device testing system according to this exemplary embodiment includes a driver module 1000 for driving a liquid crystal display panel 100, and a testing module 2000 for supplying a plurality of test voltages and signals to the driver module 1000. The driver module 1000 includes a gate driver unit 200, a data driver unit 300, a gradation voltage generating unit 500, a converter unit 600, a timing control unit 700, a switching unit 400 for vertical synchronization start signals, a first connector unit 3100, and a second connector unit 3200. The test voltages and signals include a test reference voltage HAVDD, a test gate turn-on voltage HVon, a test gate turn-off voltage HVoff, and a test vertical synchronization start signal HSTV.

A display device 1001 may include the liquid crystal display panel 100 and the driver module 1000. The display device 1001 will first be described below.

The liquid crystal display panel 100 includes a plurality of horizontally extending gate lines G1 to Gn, a plurality of vertically extending data lines D1 to Dm, and a plurality of pixels provided at intersections between the gate lines G1 to Gn and the data lines D1 to Dm. In this case, the plurality of gate lines G1 to Gn are connected to the gate driver unit 200, and the plurality of data lines D1 to Dm are connected to the data driver unit 300. Each of the pixels includes a thin film transistor T connected to a corresponding one of the gate lines G1 to Gn and a corresponding one of the data lines D1 to Dm, and liquid crystal and storage capacitors Clc and Cst connected to the thin film transistor T. The liquid crystal capacitor Clc includes a pixel electrode (not shown) connected to the thin film transistor T, a common electrode (not shown) spaced apart from the pixel electrode by a predetermined distance, and a liquid crystal layer provided in the space formed between the pixel electrode and the common electrode. The storage capacitor Cst is formed with a pixel electrode, and a storage line (not shown), a portion of which overlaps the pixel electrode.

The gate driver unit 200 sequentially supplies the gate turn-on voltage Von and the gate turn-off voltage Voff from the converter unit 600 to the plurality of gate lines G1 to Gn in response to a vertical synchronization start signal STV, or sequentially supplies the test gate turn-on voltage HVon and the test gate turn-off voltage HVoff from the testing module 2000 to the plurality of gate lines G1 to Gn in response to the test vertical synchronization start signal HSTV. The gate driver unit 200 can be manufactured in the form of a chip and provided at one side of the liquid crystal display panel 100.

The data driver unit 300 supplies an analog pixel signal to the plurality of data lines D1 to Dm using a data control signal from the timing control unit 700 and a gradation voltage or a test gradation voltage from the gradation voltage generating unit 500.

The switching unit 400 supplies either a vertical synchronization start signal STV or a test vertical synchronization start signal HSTV to the gate driver unit 200 in response to a first connection control signal (not shown). Here, the first connection control signal is generated when the testing module 2000 is connected to the driver module 1000. That is, when the testing module 2000 is connected to the driver module 1000, the first connection control signal becomes high and the switching unit 400 outputs the test vertical synchronization start, signal HSTV. On the other hand, when the testing module 2000 is not connected to the driver module 1000, the first connection control signal becomes low and the switching unit 400 outputs the vertical synchronization start signal STV. In this case, the first connection control signal may be generated in the testing module 2000 and supplied to the switching unit 400 of the driver module 1000. Therefore, it is desirable that the switching unit 400 include a circuit for receiving two inputs and one select signal and outputting one of the two inputs in response to the select signal.

The converter unit 600 operates with an external voltage and outputs a gate turn-on voltage Von, a gate turn-off voltage Voff, and a reference voltage AVDD. That is, through the external voltage, the converter unit 600 generates and supplies the gate turn-on voltage Von and the gate turn-off voltage Voff to the gate driver unit 200 and generates and supplies the reference voltage AVDD to the gradation voltage generating unit 500. In this exemplary embodiment, when the testing module 2000 is connected to the driver module 1000, the converter unit 600 is disabled. In this exemplary embodiment, the testing module 2000 supplies voltages higher than the voltages that are normally supplied to the driver module 1000. Accordingly, when the testing module 2000 is connected to the driver module 1000, additional external voltages are not applied to the driver module 1000. As a result, an external voltage is not supplied to the converter unit 600, so that the converter unit 600 is disabled. Of course, the present invention is not limited to this exemplary embodiment, and it is possible to control the operation of the converter unit 600 through a second connection control signal (not shown) additionally generated upon connection of the testing module 2000 to the driver module 1000. In this case, when the testing module 2000 is connected to the driver module 1000 and, thus, the second connection control signal becomes high, the converter unit 600 is disabled. On the other hand, when the testing module 2000 is not connected to the driver module 1000 and, thus, the second connection control signal becomes low, the converter unit 600 operates to generate the gate turn-on voltage Von, the gate turn-off voltage Voff and the reference voltage AVDD. Here, the second connection control signal may be generated in the testing module 2000 and supplied to the converter unit 600 of the driver module 1000. As the converter unit 600, a DC/DC converter may be used.

The gradation voltage generating unit 500 supplies a gradation voltage to the data driver unit 300 in response to the reference voltage AVDD, or supplies a test gradation voltage to the data driver unit 300 in response to the test reference voltage HAVDD.

The timing control unit 700 generates output signals including the data control signal and the vertical synchronization start signal STV using external control signals. The external control signals include vertical and horizontal synchronization start signals, an external clock signal, and an image data signal.

The first connector unit 3100 includes a plurality of pins. The first connector unit 3100 receives external control signals through the pins and supplies them to the timing control unit 700.

The second connector unit 3200 includes a plurality of pins. In this exemplary embodiment, the second connector unit 3200 further includes a pin for receiving the test vertical synchronization start signal HSTV. When the testing module 2000 is connected to the second connector unit 3200, the second connector unit 3200 supplies, through the respective pins, the test vertical synchronization start signal HSTV to the switching unit 400, the test gate turn-on voltage HVon and the test gate turn-off voltage HVoff to the gate driver unit 200, the test reference voltage HAVDD to the gradation voltage generating unit 500, and a test power supply voltage HVDD to the converter unit 600, the timing control unit 700 and the switching unit 400 for a vertical synchronization start signal. Preferably, the pin for receiving the test vertical synchronization start signal HSTV is connected to the switching unit 400 by a appropriate wiring. The pins for applying the test gate turn-on voltage HVon and the test gate turn-off voltage HVoff are also connected to the gate driver unit 200 by a appropriate wiring, and the pin for applying the test reference voltage HAVDD is connected to the gradation voltage generating unit 500 by a appropriate wiring.

As described above, the driver module 1000 of this exemplary embodiment displays an image on the display panel 100 using the reference voltage AVDD, the gate turn-on voltage Von, the gate turn-off voltage Voff, and the vertical synchronization start signal STV, or using the test reference voltage HAVDD, the test gate turn-on voltage HVon, the test gate turn-off voltage HVoff, and the test vertical synchronization start signal HSTV, depending on whether the testing module 2000 is connected with the driver module 1000.

The testing module 2000 will now be described.

As shown in FIG. 2, the testing module includes a voltage generating unit 2100 for generating test voltages including the test reference voltage HAVDD, the test gate turn-on voltage HVon and the test gate turn-off voltage HVoff, a signal generating unit 2200 for generating the test vertical synchronization start signal HSTV, and an input/output unit 2300 for outputting the test voltages and signals.

The voltage generating unit 2100 includes first to fourth voltage generating units 2110, 2120, 2130, and 2140 for receiving external voltages to generate test voltages. The first voltage generating unit 2110 receives an external voltage via the input/output unit 2300 to generate the test reference voltage HAVDD. Preferably, the test reference voltage HAVDD is 0 to 100% higher or lower than the reference voltage. AVDD generated in the converter unit 600 of the driver module. In this case, 0% means that the test reference voltage HAVDD is not relatively higher or lower than the reference voltage AVDD. The test reference voltage HAVDD is advantageously about 10 to 50% higher than the reference voltage AVDD. For example, when the reference voltage AVDD is 10V, the test reference voltage HAVDD preferably ranges from 10 to 20V. The second voltage generating unit 2120 receives an external voltage via the input/output unit 2300 to generate the test gate turn-on voltage HVon. The test gate turn-on voltage HVon is 0 to 100% higher or lower than the gate turn-on voltage Von from the converter unit 600. The third voltage generating unit 2130 receives an external voltage via the input/output unit 2300 to generate the test gate turn-off voltage HVoff. The test gate turn-off voltage HVoff is 0 to 100% higher or lower than the gate turn-off voltage Voff. The fourth voltage generating unit 2140 receives an external voltage to generate the test power supply voltage HVDD for operation of each portion in the driver module 1000. The test power supply voltage HVDD is 0 to 100% higher or lower than a normal voltage VDD supplied to the driver module 1000. This test power supply voltage HVDD is supplied to the timing control unit 700, the converter unit 600, the switching unit 400, the data driver unit 300, and the gate driver unit 200.

The signal generating unit 2200 generates a test vertical synchronization start signal HSTV having a variety of frequencies in response to a predetermined operation control signal. The test vertical synchronization start signal HSTV has a frequency identical to or higher or lower than that of the vertical synchronization start signal STV of the timing control unit 700. The test vertical synchronization start signal HSTV has a frequency 0 to 100% higher or lower than that of the vertical synchronization start signal STV. The test vertical synchronization start signal HSTV advantageously has a frequency from 30 to 100 Hz. The frequencies of the vertical synchronization start signal STV and the test vertical synchronization start signal HSTV become a frame frequency. The signal generating unit 2200 can be a function generator for generating a signal having an easily variable waveform and frequency. Here, the function generator is in the form of a chip, which is an effective embodiment.

In this exemplary embodiment, a defect of the driver module 1000 can be detected by using the testing module 2000 that supplies the test voltages higher or lower than the normal voltages of the driver module 1000. For example, a defect of the liquid crystal display panel 100 can be detected by supplying test voltages that is higher than the normal operation voltages to the gate driver unit 200 and the gradation voltage generating unit 500. That is, it is possible to test whether the thin film transistor T and the liquid crystal capacitor Clc operate when high voltage stress (HVS) is applied. In this exemplary embodiment, a defect of the driver module 1000 can be also detected through the testing module 2000 that supplies a test vertical synchronization start signal HSTV that has a frequency higher or lower than that of the vertical synchronization start, signal STV of the driver module 1000 used in a normal operation. For example, it is possible to test whether image sticking or flickering is generated by applying to the gate driver 200 a test vertical synchronization start signal HSTV having a frame frequency that is lower or higher than a normal frame frequency.

This test method will be described in greater detail below.

First, the testing module 2000 is connected to the second connector unit 3200. The voltage generating unit 2100 of the testing module 2000 supplies the test reference voltage HAVDD generated therein to the gradation voltage generating unit 500, and the test gate turn-on voltage HVon and the test gate turn-off voltage HVoff to the gate driver unit 200. At this time, the gate driver unit 200, the data driver unit 300 and the timing control unit 700 are enabled by the test power supply voltage HVDD from the voltage generating unit 2100. As described above, when the test voltages are applied from the voltage generating unit 2100, the converter unit 600 is disabled.

Meanwhile, when the test vertical synchronization start signal HSTV of a first frequency is applied from the signal generating unit 2200 of the testing module 2000, the switching unit 400 applies the test vertical synchronization start signal HSTV to the gate driver unit 200. The first frequency is advantageously the same as a normal frame frequency for the driver module. Accordingly, the first frequency is 60 Hz, which is an effective frequency.

As shown in FIG. 3, when the test vertical synchronization start signal HSTV of the first frequency is applied to the gate driver unit 200, the gate driver unit 200 sequentially applies the test gate turn-on voltage HVon to the first to n-th gate lines G1 to Gn of the liquid crystal display panel 100 within approximately one period of the signal frequency. Accordingly, a plurality of thin film transistors T connected to the gate lines are turned on. At this time, the data driver unit 300 supplies an analog pixel signal to the data lines D1 to Dm of the liquid crystal display panel 100 in response to the test gradation voltage generated using the test reference voltage HVDD and the data control signal. The analog pixel signal on the data lines D1 to Dm is charged in the pixel electrode of the pixel capacitor Clc via the turned-on thin film transistor T. The analog pixel signal charged in the pixel electrode changes the electric field across the pixel capacitor Clc, resulting in a change in orientation of the liquid crystal in the pixel capacitor Clc. The changed liquid crystal orientation causes a change in light transmittance of a light source, which is provided at a lower end of the driver module 1000. This adjusts the amount of light that is transmitted by the R, G and B color filters (not shown) so that a desired image is displayed.

In this exemplary embodiment, it is possible to test for a defect that may occur when a high test voltage is applied to the thin film transistor T and the pixel capacitor Clc of the liquid crystal display panel 100. That is, when the high test voltage is applied, some of the thin film transistors T and pixel capacitors Clc may not operate normally due to the high voltage stress. In this case, a pixel including the thin film transistor T and pixel capacitor Clc that do not operate normally cannot display a desired image. Thus, with the testing module 200 according to this exemplary embodiment, it is possible to test for a defect in each thin film transistor T.

In this exemplary embodiment, it is also possible to test for a defect occurring in the liquid crystal display panel 100 when the frequency of the test vertical synchronization start signal HSTV is changed.

When horizontal clock periods 1H of the gate turn-on voltages Von/HVon that are applied to the gate lines are the same, the frame time (1F; one period of the vertical synchronization start signal STV) in a normal operation becomes the same as a time in which the gate turn-on voltages Von/HVon are supplied to all the gate lines G1 to Gn. When a time to display one frame increases or decreases by changing a period of the test vertical synchronization start signal HSTV, however, the frame time 1F is not consistent with the time in which the gate turn-on voltages Von/HVon are supplied to all the gate lines G1 to Gn.

That is, as shown in FIG. 3, the test vertical synchronization start signal HSTV of the first frequency of 60 Hz is applied. Accordingly, for 1/60 second, the test gate turn-on voltage HVon is sequentially applied to the first to n-th gate lines G1 to Gn. At this time, the test gate turn-on voltage HVon is applied to each of the gate lines G1 to Gn during one horizontal clock period 1H, in which each thin film transistor T is turned on and, thus, a pixel signal is charged in the pixel capacitor Clc. On the other hand, as shown in FIG. 4, when the test vertical synchronization start signal HSTV of a second frequency (for example, 50 Hz) lower than the first frequency is applied, the test gate turn-on voltage HVon is sequentially applied to the first to n-th gate lines G1 to Gn for 1/50 second. At this time, however, the test gate turn-on voltage HVon is applied to each of the gate lines G1 to Gn during a 1H period identical to that for 60 Hz. Thus, when the frequency of the test vertical synchronization start signal HSTV is lowered, a section (see section A of FIG. 4) is generated in which the test gate turn-on voltage HVon is not supplied to all the gate lines G1 to Gn during a certain time after being supplied thereto, as shown in FIG. 4. That is, a predetermined pixel signal is charged in the liquid crystal capacitor Clc of the pixel and is maintained during a certain period, thereby causing the image sticking and flickering phenomenon. Thus, with the testing module 2000 according to this exemplary embodiment, it is possible to test for defects, such as the image sticking and flickering phenomenon.

In FIGS. 3 and 4, the test gate voltage HVon is applied to the first gate line G1 at a falling edge of the test vertical synchronization start signal HSTV. The present invention, however, is not limited to that exemplary embodiment, and the test gate voltage HVon may be applied to the first gate line G1 at a rising edge of the test vertical synchronization start signal HSTV.

The testing module 2000 according to this exemplary embodiment has a structure that is easily mounted to and detached from the second connector unit 3200 of the driver module 1000.

Hereinafter, the configurations of the liquid crystal display panel 100, the driver module 1000, and the testing module 2000 according to this exemplary embodiment will be described.

The liquid crystal display panel 100 includes a lower substrate 110 and an upper substrate 120 each of which has a display area D and a peripheral area P, and which are closely adhered to each other, as shown in FIG. 5. The display area D of the lower substrate 110 includes the plurality of horizontally extending gate lines G1 to Gn, the plurality of vertically extending data lines D1 to Dm, and the thin film transistors T and the pixel electrodes provided at intersections between the gate lines G1 to Gn and the data lines D1 to Dm. The peripheral area P of the lower substrate 110 includes a gate pad (not shown) connected to the gate lines G1 to Gn and a data pad (not shown) connected to the data lines D1 to Dm. The display area D of the upper substrate 120 includes a common electrode (not shown), a color filter (not shown), and a black matrix (not shown) for preventing leakage of light. The peripheral area P of the upper substrate 120 includes a black matrix. A liquid crystal layer (not shown) is provided between the lower substrate 110 and the upper substrate 120.

In the liquid crystal display panel 100, the peripheral area P of the lower substrate 110 is provided with the gate driver unit 200 of the driver module 1000. In this exemplary embodiment, the gate driver unit 200 in the form of an IC chip is used and is mounted at one side of the peripheral area P of the lower substrate 110. The gate driver unit 200 is electrically connected to the gate pad (not shown) provided in the peripheral area P of the lower substrate 110. Accordingly, the gate driver unit 200 is electrically connected to the gate lines G1 to Gn provided in the display area D via the gate pad. Although the gate driver unit 200 is shown in the form of a single chip in FIG. 5, the present invention is not limited to this exemplary embodiment, and the gate driver unit 200 may include a plurality of chips.

The data driver unit 300, the gradation voltage generating unit 500, the converter unit 600, the timing control unit 700, and the switching unit 400 of the driver module 1000 are provided on the first printed circuit board 3000. The first printed circuit board 3000 includes the first connector unit 3100 for receiving external control signals, and the second connector unit 3200 for receiving external voltages, and in FIG. 5, the two connectors are shown separately. The present invention is not limited to this exemplary embodiment, however, and a plurality of separate connectors or a single connector may be provided depending on the features of the input signals and voltages. Using the plurality of control signals and external voltages applied via the first and second connector units 3100 and 3200, the first printed circuit board 3000 supplies the plurality of signals and voltages for use in displaying an image to the liquid crystal display panel 100. The first printed circuit board 3000 is physically spaced apart from the liquid crystal display panel 100. Thus, the first printed circuit board 3000 can be electrically connected to the liquid crystal display panel 100 through a flexible printed circuit board 3300. By bending the flexible printed circuit board 3300, the first printed circuit board 3000 may be located on a rear side of the liquid crystal display panel 100. This can reduce the overall size of the driver module 1000.

Each of the data driver unit 300, the gradation voltage generating unit 500, the converter unit 600, the timing control unit 700, and the switching unit 400 can be advantageously manufactured in the form of a chip and mounted in a predetermined area of the first printed circuit board 3000.

The data driver unit 300 is electrically connected to the data pad provided in the peripheral area P of the lower substrate 110 of the liquid crystal display panel 100 through the flexible printed circuit board 3300. The data driver unit 300 may be composed of a plurality of chips, and the data driver unit 300 can be electrically connected to the gradation voltage generating unit 500 in the first printed circuit board 3000.

The gradation voltage generating unit 500 is electrically connected to the converter unit 600. The converter unit 600 is electrically connected to the gate driver unit 200 mounted on the liquid crystal display panel 100 through the flexible printed circuit board 3300. The converter unit 600 is also electrically connected to the second connector unit 3200. Accordingly, the converter unit 600 receives the external voltage, and then supplies the reference voltage AVDD to the gradation voltage generating unit 500 and the gate turn-on voltage Von and the gate turn-off voltage Voff to the gate driver unit 200. In this case, the gradation voltage generating unit 500 and the gate driver unit 200 may be directly electrically connected to the second connector unit 3200. Accordingly, when the testing module 2000, which will be described in detail below, is connected to at least a portion of the second connector unit 3200, through the second connector unit 3200, the test reference voltage HAVDD can be directly supplied to the gradation voltage generating unit 500 and the test gate turn-on voltage HVon and the test gate turn-off voltage HVoff can be directly supplied to the gate driver unit 200. The converter unit 600 is connected to the timing control unit 700 and the second connector unit 3200. Accordingly, the operation of the converter unit 600 can be controlled.

The switching unit 400 is connected to the timing control unit 700 and the second connector unit 3200 in the first printed circuit board 3000 and is electrically connected to the gate driver unit 200 through the flexible printed circuit board 3300. For this electrical connection, a predetermined wiring can be used. In this case, the wiring may include a conductive wire formed in the first printed circuit board 3000, the flexible printed circuit board 330, and the liquid crystal display panel 100.

The switching unit 400 may supply the test vertical synchronization start signal HSTV of the testing module 2000 to the gate driver unit 200 through the second connector unit 3200, or it can supply the vertical synchronization start signal STV of the timing control unit 700 to the gate driver unit 700. In this case, the operation of the switching unit 400 may be controlled by a signal from the second connector unit 3200 or from the first connector unit 3100. The timing control unit 700 is electrically connected to the first connector unit 3100 and the data driver unit 300, and the timing control unit 700 receives an external control signal to supply the data control signal to the data driver unit 300.

The signal generating unit 2200, the voltage generating unit 2100, and the input/output unit 2300 of the testing module 2000 according to this exemplary embodiment are advantageously provided on a second printed circuit board 4000.

The input/output unit 2300 is provided in the form corresponding to the second connector unit 3200 on the second printed circuit board 4000. Accordingly, the input/output unit 2300 receives the input voltage and the control signal to control the operation of the signal and voltage generating units 2200 and 2100. Also, the input/output unit 2300 is partially connected to at least a portion of the second connector unit 3200 of the first printed circuit board 3000. This allows the input/output unit 2300 to supply the outputs of the signal and voltage generating units 2200 and 2100 to the first printed circuit board 3000. In this case, the input/output unit 2300 may be connected to the second connector unit 3100. The signal generating unit 2200 generates the test vertical synchronization start signal HSTV, and its frequency can be varied in response to an external control signal. The voltage generating unit 2100 changes the input voltage using the first to fourth voltage generating units 2110, 2120, 2130, and 2140 to generate the test reference voltage HAVDD, the test gate turn-on voltage HVon, the test gate turn-off voltage HVoff, and the test power supply voltage HVDD.

In this exemplary embodiment, as shown in FIG. 5, it is possible to test the operation of the liquid crystal display panel 100 connected to the driver module 1000 by coupling the input/output unit 2300 of the second printed circuit board 4000 to the voltage input connector unit 3200 of the first printed circuit board 3000. At this time, an additional signal supplying unit 5000 for applying a test control signal can be connected to the first connector unit 3100 of the first printed circuit board 3000, as shown in FIG. 5.

The operation test using the above-described system will be briefly described as follows.

The input/output unit 2300 of the second printed circuit board 4000 is connected to the second connector unit 3200 of the first printed circuit board 3000, and the signal supplying unit 5000 is connected to the second connector unit 3100 of the first printed circuit board 3000. The signal and voltage generating units 2200 and 2100 of the second printed circuit board 4000 are then operated. The signal generating unit 2200 generates the test vertical synchronization start signal HSTV and supplies it to the switching unit 400 through the second connector unit 3200 of the first printed circuit board 3000. The voltage generating unit 2100 generates and supplies the test reference voltage HAVDD to the gradation voltage generating unit 500, and the test gate turn-on voltage HVon and the test gate turn-off voltage HVoff to the gate driver unit 200. The voltage generating unit 2100 also generates the test power supply voltage HVDD and supplies it to each portion of the driver module 1000. Meanwhile, the control signal is applied to the tinting control unit 700 through the signal supplying unit 5000. The timing control unit 700 supplies the vertical synchronization start signal STV to the switching unit 400, and the data control signal to the data driver unit 300. In this case, when the input/output unit 2300 is electrically connected to the second connector unit 3200, the second connector unit 3200 disables the converter unit 600 and an operation control signal is generated for controlling the operation of the switching unit 400. Of course, this exemplary embodiment is not limited thereto and an additional operation signal generating unit for generating the operation control signal may be provided on the second printed circuit board 4000. The switching unit 400 applies the test vertical synchronization start signal HSTV to the gate driver unit 200 in response to the operation control signal. Accordingly, the gate driver unit 200 sequentially supplies the test gate turn-on voltage HVon and the test gate turn-off voltage HVoff to the gate lines G1 to Gn. Meanwhile, the gradation voltage generating unit 500 receives the test reference voltage HAVDD, and generates and supplies the test gradation voltage to the data driver unit 300. The data driver unit 300 supplies the data signal to the data lines D1 to Dm according to the test gradation voltage and the data control signal. Accordingly, by driving the liquid crystal display panel 100 in this way it can be determined whether it has a defect. After the operation of the liquid crystal display panel 100 is tested, the second printed circuit board 4000 is separated from the first printed circuit board 3000.

Although the gate driver unit 200 has been described as being mounted on the lower substrate 110 of the liquid crystal display panel 100, the present invention is not limited to that exemplary embodiment. For example, the gate driver unit 200 may be mounted on an additional third printed circuit board (not shown), and the third printed circuit board may be connected to the liquid crystal display panel 100 through the flexible printed circuit board. In this case, the switching unit 400 may be provided on the third printed circuit board.

The present invention is not limited to this exemplary embodiment and various modifications may be made thereto.

Figure 6:
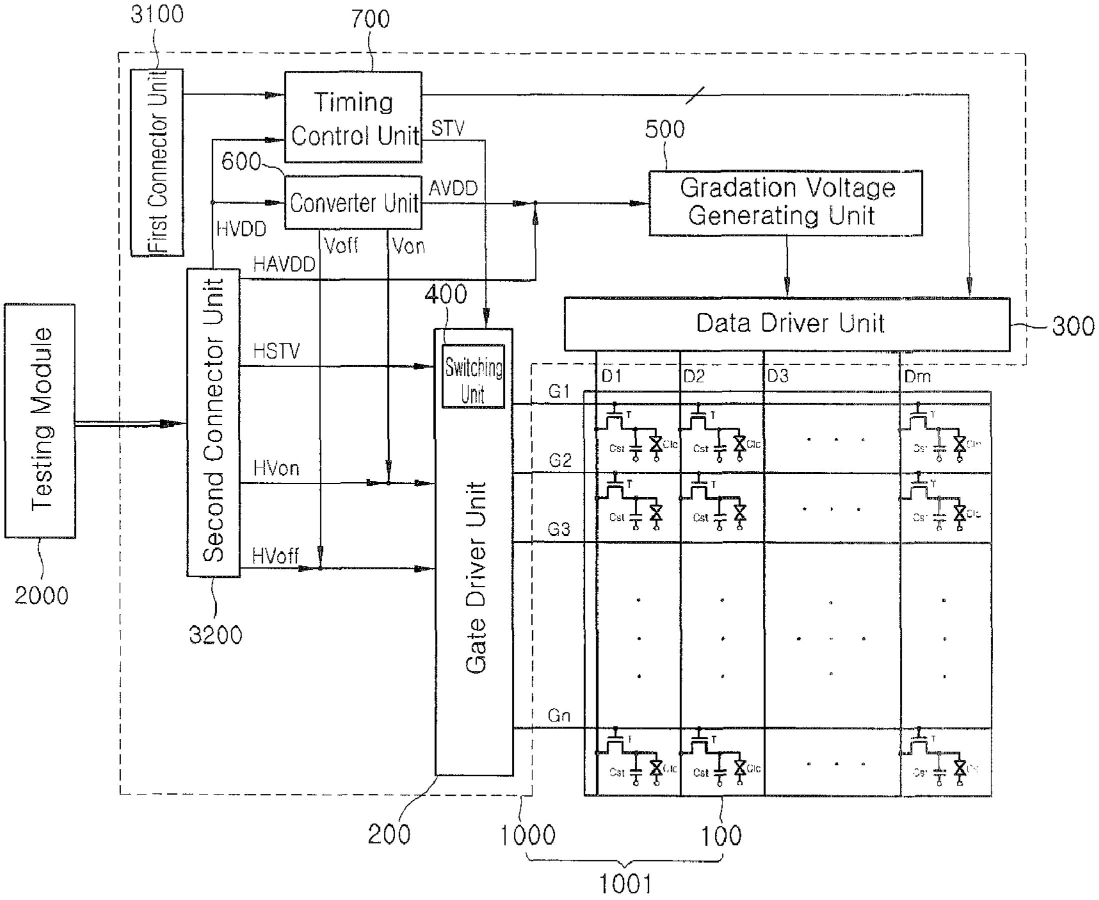
FIGS. 6 and 7 are conceptual block diagrams illustrating a display device testing system according to exemplary embodiments of the present invention.

As shown in FIG. 6, the switching unit 400 may be provided in the gate driver unit 200. That is, the switching unit 400 may be provided as a circuit module in the gate driver unit 200, which is in the form of a chip in which a plurality of circuits are integrated. In this case, when the vertical synchronization start signal STV is applied to the gate driver unit 200, the switching unit 400 sends the vertical synchronization start signal STV to an internal circuit of the gate driver unit 200. On the other hand, when the vertical synchronization start signal STV and the test vertical synchronization start signal HSTV are applied to the gate driver unit 200, the switching unit 400 sends the test vertical synchronization start signal HSTV to the internal circuit of the gate driver unit 200. That is, in a normal mode, only the vertical synchronization start signal STV that is an output of the timing control unit 700 is applied to the gate driver unit. In a test mode in which the testing module 2000 is connected, however, the test vertical synchronization start signal HSTV that is an output of the testing module 2000 is additionally applied to the gate driver unit 200. Thus, when the two signals, that is, the vertical synchronization start signal STV and the test vertical synchronization start signal HSTV, are applied, transmission of the vertical synchronization start signal STV is blocked while the test vertical synchronization start signal HSTV is applied. The switching unit 400 in the gate driver unit 200 is electrically connected to an output terminal of the vertical synchronization start signal STV of the timing control unit 700. The switching unit 400 is also electrically connected to a pin for receiving the test vertical synchronization start signal HSTV of the second connector unit 3200 connected with the testing module 2000.

Figure 7:
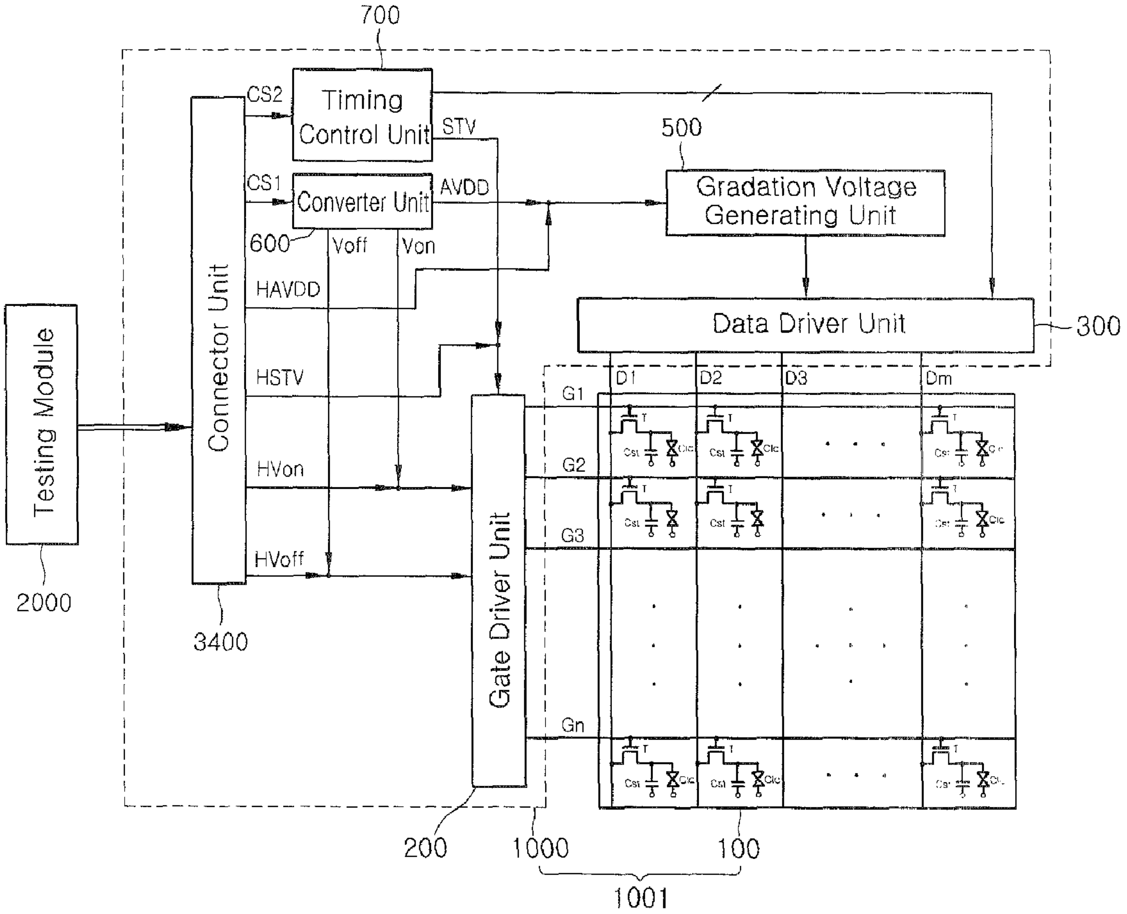

As shown in FIG. 7, a testing module 2000 may generate first and second test control signals CS1 and CS2 to control operation of a converter unit 600 and a timing control unit 700, respectively. In this case, a driver module 1000 includes a single connector unit 3400, to which the testing module 2000 is connected. This allows the testing module 2000 to disable overall operation of the converter unit 600 using the first test control signal CS1 and to disable some operations of the timing control unit 700 using the second test control signal CS2.

In other words, the testing module 2000 disables the operation of circuits related to the generation of the vertical synchronization start signal STV in the timing control unit 700. To this end, the respective circuits in the timing control unit 700 can be separately operated. The testing module 2000 connected to the connector 3400 may also supply a data signal related control signal to the timing control unit 700.

Accordingly, a vertical synchronization start signal STV, a gate turn-on voltage Von, a gate turn-off voltage Voff, and a reference voltage AVDD of the driver module 1000 are blocked from being generated. A test vertical synchronization start signal HSTV, a test gate turn-on voltage HVon and a test gate turn-off voltage HVoff, which are outputs of the testing module 2000, are provided instead to the gate driver unit 200, and a test reference voltage HAVDD is supplied to the gradation voltage generating unit 500. This may eliminate the need for an additional switching unit 400 for switching the vertical synchronization start signal STV and the test vertical synchronization start signal HSTV.

This exemplary embodiment is not limited thereto, and the operation of the converter unit 600 and the timing control unit 700 may be disabled using the first and the second test control signals CS1 and CS2, respectively. In this case, because the second test operation control signal CS2 disables the timing control unit 700, the testing module 2000 may supply image information related to a test image data signal to the data driver unit 300. The testing module 2000 can further include an additional test unit (not shown) serving as the timing control unit 700. In this case, the test unit can include the aforementioned signal generating unit 2200. The testing module 2000 supplies the test image data signal to the data driver unit 3000 and the test vertical synchronization start signal HSTV to the gate driver unit 200. In this manner, the testing module 2000 can test for a defect of the liquid crystal display panel 100 using the test signals and voltages.

Although in the above-described exemplary embodiment, the gate driver unit has been described as being mounted in the form of a chip on the lower substrate, the present invention is not limited to this exemplary embodiment. For example, the gate driver unit may be formed at one side of the peripheral area when the thin film transistors are formed in the display area of the lower substrate. An additional control signal generating unit for driving such a gate driver unit may be included. A display device testing system and a testing method according to an exemplary embodiment of the present invention capable of testing a driver module in which a gate driver unit is formed on a lower substrate of a liquid crystal display panel will be described. The descriptions overlapping with the above-described exemplary embodiment will be omitted.

Figure 8:
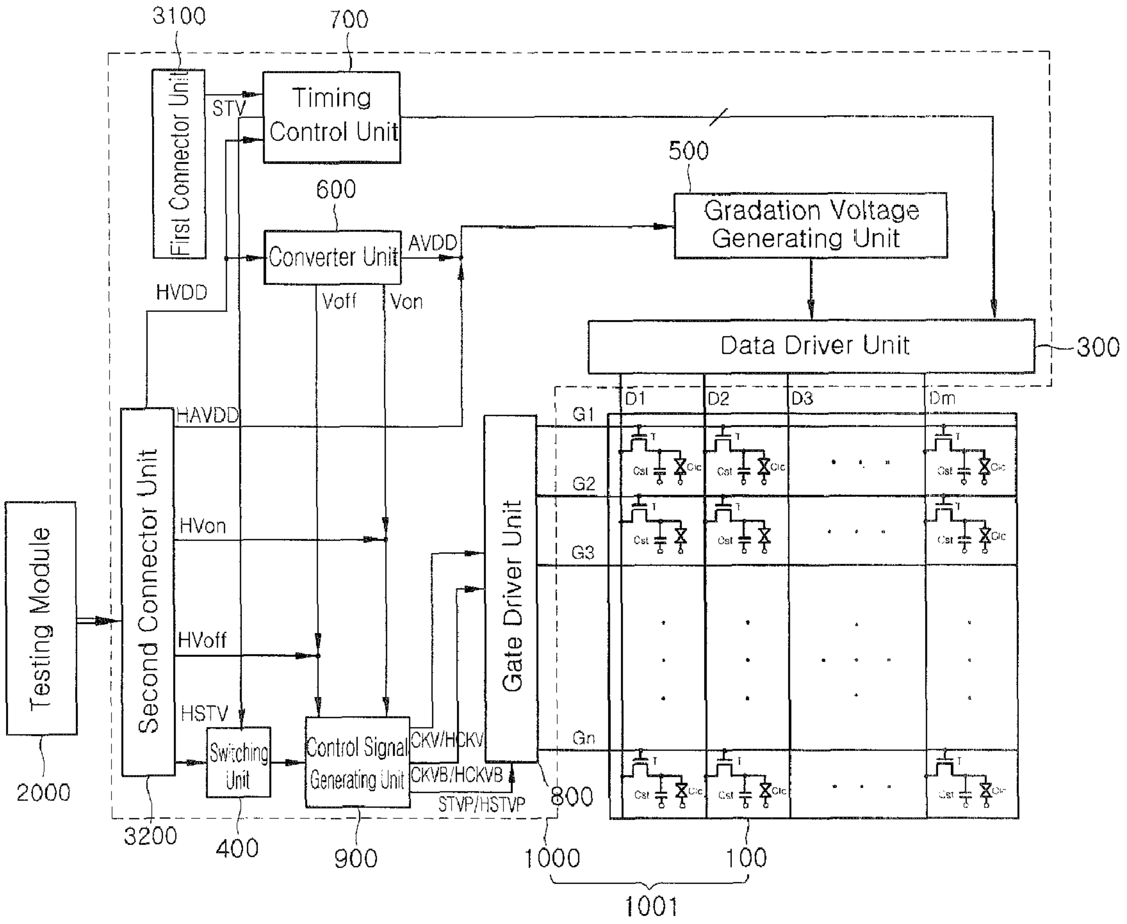
FIG. 8 is a conceptual block diagram illustrating a display device testing system according to an exemplary embodiment of the present invention.

FIG. 8 is a conceptual block diagram illustrating a display device testing system according to an exemplary embodiment of the present invention.

Referring to FIG. 8, the display device testing system according to this exemplary embodiment includes a driver module 1000 and a testing module 2000. The driver module 1000 includes a gate driver unit 800, a data driver unit 300, a gradation voltage generating unit 500, a converter unit 600, a timing control unit 700, a switching unit 400, a control signal generating unit 900, a first converter 3100 and a second converter 3200, for driving a liquid crystal display panel 100. The testing module 2000 includes a signal generating unit 2200 for generating a test vertical synchronization start signal HSTV, and a voltage generating unit 2100 for generating a plurality of test voltages. The testing module 2000 is connected to a portion of the second converter 3200.

The liquid crystal display panel 100 includes a display area D and a peripheral area P, as shown in FIG. 5. The display area D includes a plurality of gate lines G1 to Gn, data lines D1 to Dm and a plurality of pixels. The plurality of gate lines G1 to Gn, data lines D1 to Dm, thin film transistors T and pixel electrodes of the pixels are provided in a display area D of a lower substrate, and a common electrode and a color filter corresponding to each pixel electrode are provided in a display area D of an upper substrate. A liquid crystal layer is provided between the display areas D of the upper and lower substrates.

The gate driver unit 800 of FIG. 8 supplies a gate turn-on voltage Von and a gate turn-off voltage Voff to the plurality of gate lines G1 to Gn in the display area D according to a clock signal CKV, an inverted clock signal CKVB and a start signal STVP. The gate driver unit 800 also supplies a test gate turn-on voltage HVon and a test gate turn-off voltage HVoff to the plurality of gate lines G1 to Gn of the display area according to a test clock signal HCKV, a test inverted clock signal HCKVB and a test start signal HSTVP.

The gate driver unit 800 includes a plurality of stages (not shown) respectively connected to the plurality of gate lines G1 to Gn. Each stage receives the clock signal CKV and the inverted clock signal CKVB, or the test clock signal HCKV and the test inverted clock signal HCKVB, and supplies the gate voltage.

The first stage supplies the clock signal CKV or the test clock signal HCKV as a gate voltage to the first gate line G1 in response to the start signal STVP or the test start signal HSTVP. Each of the other stages supplies the clock signal CKV or the test clock signal HCKV as a gate voltage for each of the gate lines G2 to Gn in response to a gate voltage that is an output of a previous stage. Thus, each stage is reset by an output of a subsequent stage. The last stage may be reset by an additional start signal. The gate driver unit 800 according to this exemplary embodiment can be formed in the peripheral area P of the lower substrate.

The gate driver unit 800 can be advantageously provided in the peripheral area P of the liquid crystal display panel 100, and the plurality of stages in the gate driver unit 800 can be provided in the peripheral area P of the lower substrate. The plurality of stages may be formed at the same time with the thin film transistors T of the pixels, which is an effective manufacturing approach.

In this exemplary embodiment, the driver module 1000 includes a control signal generating unit 900 that receives a gate turn-on voltage Von and a gate turn-off voltage Voff of the converter unit 600 to generate the clock signal CKV and the inverted clock signal CKVB or that receives the test gate turn-on voltage HVon and the test gate turn-off voltage HVoff of the testing module 2000 to generate the test clock signal HCKV and the test inverted clock signal HCKVB. The control signal generating unit 900 receives the vertical synchronization start signal STV or the test vertical synchronization start signal HSTV of the switching unit 400 to generate the start signal STVP and the test start signal HSTVP. In this case, the switching unit 400 may be made integrally with the control signal generating unit 900.

In the display device testing system according to this exemplary embodiment, the testing module 2000 operates to supply the test vertical synchronization start signal HSTV to the switching unit 400. Accordingly, the switching unit 400 then outputs the test vertical synchronization start signal HSTV. The test vertical synchronization start signal HSTV of the switching unit 400 is supplied to the control signal generating unit 900. The control signal generating unit 900 receives the test gate turn-on voltage HVon and the test gate turn-off voltage HVoff of the testing module 2000, as well as the test vertical synchronization start signal HSTV. Accordingly, the control signal generating unit 900 generates and supplies the test clock signal HCKV and the test inverted clock signal HCKVB to the plurality of stages of the gate driver unit 800 and supplies the test vertical synchronization start signal HSTV to the first stage.

The first stage receives the test vertical synchronization start signal HSTV, the test clock signal HCKV, and the test inverted clock signal HCKVB and supplies the gate voltage to the first gate line G1 connected to the first stage. The gate voltage is then supplied to the second stage. The second stage receives the gate voltage supplied to the first gate line G1, the test clock signal HCKV, and the test inverted clock signal HCKVB and supplies the gate voltage to the second gate line G2 connected to the second stage. The gate voltage supplied to the second gate line G2 is then also supplied to the first stage and so as to reset it. The gate voltage supplied to the second gate line G2 is also supplied to the third stage. In this manner, the gate voltages are sequentially supplied to the plurality of gate lines G4 to Gn. In this case, when the plurality of gate lines G1 to Gn are sequentially turned on, the data driver unit 300 sequentially supplies test data signals to the plurality of data lines D1 to Dm. With the test gate voltage and the test data signal, the plurality of pixels are driven and whether the liquid crystal display panel 100 operates or not is tested, it is also possible to test whether the liquid crystal display panel 100 is defective or not in view of variation of the frame frequency by changing the frequency of the test start signal HSTV.

While in the above-described exemplary embodiment, the testing module generates the test voltages and signals, which are used to test whether the liquid crystal display panel is defective or not according to over-voltage and variation of the frame frequency, the present invention is not limited to this exemplary embodiment. For example, the testing module may generate only the test vertical synchronization start signal, which is used to test whether the liquid crystal display panel is defective according to a variation of the frame frequency. A display device testing system and a method for testing the same capable of testing a driver module using a vertical synchronization start signal according to an exemplary embodiment of the present invention will now be described. Descriptions overlapping with the above-described exemplary embodiments will be omitted.

Figure 9:
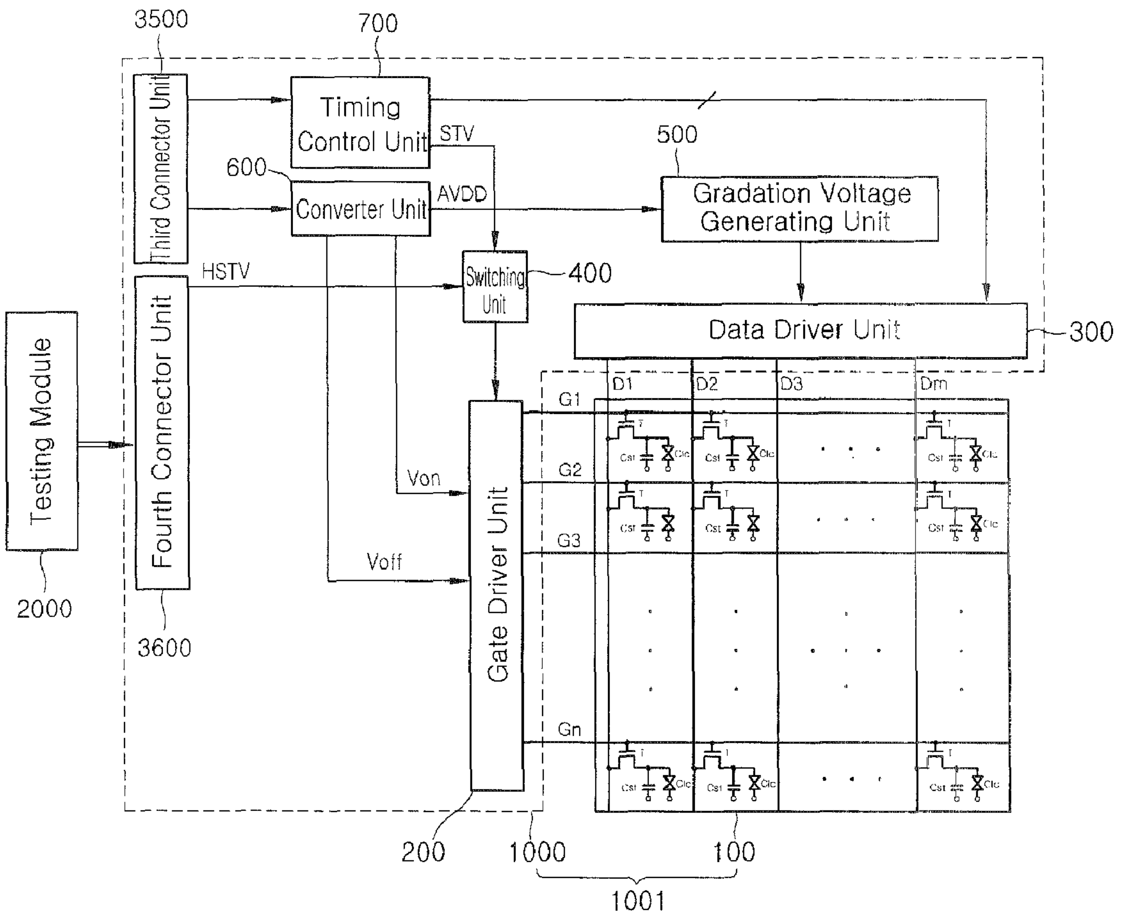
FIG. 9 is a conceptual block diagram illustrating a display device testing system according to an exemplary embodiment of the present invention.

FIG. 9 is a conceptual block diagram illustrating a display device testing system according to an exemplary embodiment of the present invention.

Referring to FIG. 9, the display device testing system according to this exemplary embodiment includes a driver module 1000 and a testing module 2000.

The driver module 1000 includes a gate driver unit 200, a data driver unit 300, a switching unit 400, a gradation voltage generating unit 500, a converter unit 600, a timing control unit 700, a third connector 3500, and a fourth connector 3600, for driving the liquid crystal display panel 100. The testing module 2000 includes a signal generating unit for supplying a test vertical synchronization start signal HSTV.

In the driver module 1000, the switching unit 400 supplies a test vertical synchronization start signal HSTV of the testing module 2000 or a vertical synchronization start signal STV of the timing control unit 700 to the gate driver unit 200. The gate driver unit 200 supplies a gate turn-on voltage Von of the converter unit 600 to a plurality of gate lines G1 to Gn of the liquid crystal display panel 100 in response to the test vertical synchronization start signal HSTV or in response to the vertical synchronization start signal STV of the switching unit 400. The converter unit 600 receives an external voltage to supply the gate turn-on voltage Von and the gate turn-off voltage Voff to the gate driver unit 200 or to supply a reference voltage AVDD to the gradation voltage generating unit 500. The gradation voltage generating unit 500 receives the reference voltage AVDD to supply a gradation voltage (that is, a gamma voltage) to the data driver unit 300. The data driver unit 300 supplies a data signal to the plurality of data lines D1 to Dm of the liquid crystal display panel 100 in response to the gradation voltage and the data image signal of the timing control unit 700. According to this exemplary embodiment, the third connector 3500 includes a plurality of pins (not shown) and supplies external control signals and power supply voltages, which are applied via the pins, to the timing control unit 700 and the converter unit 600, respectively. The fourth connector 3600 includes a pin for receiving the test vertical synchronization start signal HSTV and provides the test vertical synchronization start signal HSTV to the switching unit 400 via the pin.

The testing module 2000 according to this exemplary embodiment supplies the test vertical synchronization start signal HSTV to the driver module 1000 to change the frame frequency for the liquid crystal display panel 100. That is, the testing module 2000 is connected to the fourth connector 3600 of the driver module 1000 and supplies the test vertical synchronization start signal HSTV to the switching unit 400. The switching unit 400 supplies the received test vertical synchronization start signal HSTV to the gate driver unit 200. The testing module 2000 supplies only the test vertical synchronization start signal HSTV. Preferably, external control signals and power supply voltages used in a normal operation are supplied to the timing control unit 700 and the converter unit 600 via the third connector 3500.

Accordingly, the converter unit 600 operates to supply the gate turn-on voltage Von and gate turn-off voltage Voff used in a normal operation to the gate driver unit 200 and supplies the reference voltage AVDD to the gradation voltage generating unit 500. The gate driver unit 200 sequentially applies the gate turn-on voltage Von to the plurality of gate lines G1 to Gn in response to the test vertical synchronization start signal HSTV. The gradation voltage generating unit 500 supplies the gradation voltage to the data driver unit 300. The data driver unit 300 supplies a data signal to the plurality of data lines D1 to Dm using the gradation voltage and the data image signal of the timing control unit 700. Accordingly, the pixels of the liquid crystal display panel 100 are driven so that an image is displayed. As described in the previous exemplary embodiments, it is possible to test, a defect occurring upon changing the frame frequency for the liquid crystal display panel 100 by changing the frequency of the test vertical synchronization start signal HSTV.

Although the testing module in this exemplary embodiment has been described as being connected to the display panel via the additional connector, the present invention is not limited to this exemplary embodiment, and the testing module may provided in the display panel and operate in response to the control signal of the timing control unit.

As described above, according to exemplary embodiments of the present invention, it is possible to test whether a display panel is defective or not according to variation of the frame frequency.

It is also possible to test whether the driver module normally operates or not even at a voltage higher than a normal operation voltage, as well as whether the display panel is defective or not according to variation of the frame frequency.

In addition, the display panel includes an additional switching unit, which makes it possible to supply either the vertical synchronization start signal or the test vertical synchronization start signal to the gate driver unit in response to an external signal.

Although the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A display device comprising:

a display panel including a plurality of gate lines;

a gate driver unit that sequentially supplies a gate voltage to the gate lines in response to an external test vertical synchronization start signal;

a connector unit including a pin that receives the external test vertical synchronization start signal; and a switching unit that supplies the external test vertical synchronization start signal to the gate driver unit, and that receives the external test vertical synchronization start signal, wherein the external test vertical synchronization start signal has a variable frequency.

2. The device as claimed in claim 1, further comprising a timing control unit that generates a vertical synchronization start signal.

3. The device as claimed in claim 2, wherein the pin that receives the external test vertical synchronization start signal is electrically connected to the switching unit.

4. The device as claimed in claim 1, wherein the external test vertical synchronization start signal has a frequency 0 to 100% higher or lower than a frequency of a vertical synchronization start signal.

5. The device as claimed in claim 1, wherein the connector unit comprises a first connector that receives an external control signal, and a second connector that receives the external test vertical synchronization start signal and an external test voltage.

6. The device as claimed in claim 5, wherein the external test vertical synchronization start signal has a frequency 0 to 100% higher or lower than a frequency of a vertical synchronization start signal.

7. The device as claimed in claim 5, wherein the external test voltage is 0 to 100% higher or lower than an external voltage.

8. A testing module for a display device having a gate driver unit, comprising:

a signal generating unit that supplies an external test vertical synchronization start signal having a variable frequency to the gate driver unit, wherein:

the gate driver unit sequentially supplies a gate voltage to gate lines of a display panel in response to the external test vertical synchronization start signal;

a connector unit includes a pin that receives the external test vertical synchronization start signal; and a switching unit receives the external test vertical synchronization start signal and supplies the external test vertical synchronization start signal to the gate driver unit.

9. The testing module as claim in claim 8, wherein the signal generating unit generates the external test vertical synchronization start signal having a frequency 0 to 100% higher or lower than a frequency of a vertical synchronization start signal used in a normal operation of the display device.

10. The testing module as claim in claim 8, further comprising a voltage generating unit that supplies an external test gate turn-on voltage and an external test gate turn-off voltage to the gate driver unit.

* * * * *